United States Patent [19]

Sato et al.

[11] Patent Number: 5,446,317
[45] Date of Patent: Aug. 29, 1995

[54] SINGLE IN-LINE PACKAGE FOR SURFACE MOUNTING

[75] Inventors: Mitsutaka Sato; Masanori Yoshimoto, both of Kawasaki, Japan

[73] Assignee: Fujitsu Limited, Kawasaki, Japan

[21] Appl. No.: 26,809

[22] Filed: Mar. 5, 1993

[30] Foreign Application Priority Data

Mar. 9, 1992 [JP] Japan .................. 4-050941

[51] Int. Cl.⁶ .............. H01L 23/48; H01L 29/44; H01L 29/52; H05K 7/00
[52] U.S. Cl. .................. 257/734; 257/666; 257/676; 257/730; 257/787; 361/813
[58] Field of Search .......... 257/666, 667, 734, 787; 257/730, 676, 668, 671, 678, 684, 701, 734, 787; 361/813

[56] References Cited

U.S. PATENT DOCUMENTS 4,975,763 12/1990 Baudouin et al. ............. 357/74

FOREIGN PATENT DOCUMENTS

61-174656 8/1986 Japan .
62-76659 4/1987 Japan .................. 257/787
1-166545 6/1989 Japan .

Primary Examiner—Jerome Jackson
Assistant Examiner—Carl Whitehead, Jr.
Attorney, Agent, or Firm—Staas & Halsey

[57] ABSTRACT

A semiconductor package of a single in-line type including a semiconductor chip, a package body for accommodating the semiconductor chip and a plurality of leads held by the package body to extend substantially perpendicularly to a bottom edge surface of the package body. The package body carries a cutout part at a predetermined position of a side edge that surrounds the package body such that the cutout part is adapted for engagement with a support leg for supporting the package body substantially upright on a substrate.

10 Claims, 8 Drawing Sheets

SINGLE IN-LINE PACKAGE FOR SURFACE MOUNTING

BACKGROUND OF THE INVENTION

The present invention generally relates to semiconductor devices and more particularly to a semiconductor package that has a single in-line package structure.

In order to improve the efficiency of mounting of semiconductor devices on a support substrate such as a printed circuit board, a package structure designed for surface mounting is used extensively. By using the surface mounting technology, the semiconductor device can be mounted on the circuit board without providing holes for inserting leads of the device. The soldering of the leads is achieved by merely placing the device on the circuit board and passing the device and the circuit board through a heating furnace for causing a reflow of soldering alloy. Thereby, the efficiency of the mounting process is improved significantly and the fabrication cost of electronic apparatuses that use the semiconductor devices is significantly reduced.

In order to mount the semiconductor devices as many as possible on a single support substrate, a so-called single in-line package (SIP) is proposed. In the single in-line package, the leads are provided along a single edge of a flat package body to extend perpendicularly with respect to the edge, thereof and the package body is held upright on the substrate by inserting the leads into the corresponding holes of the substrate. As the package body is held vertically on the substrate, one can increase the number of the packages that are mounted on the single substrate. Further, such a structure is advantageous for cooling the device.

Figure 1:
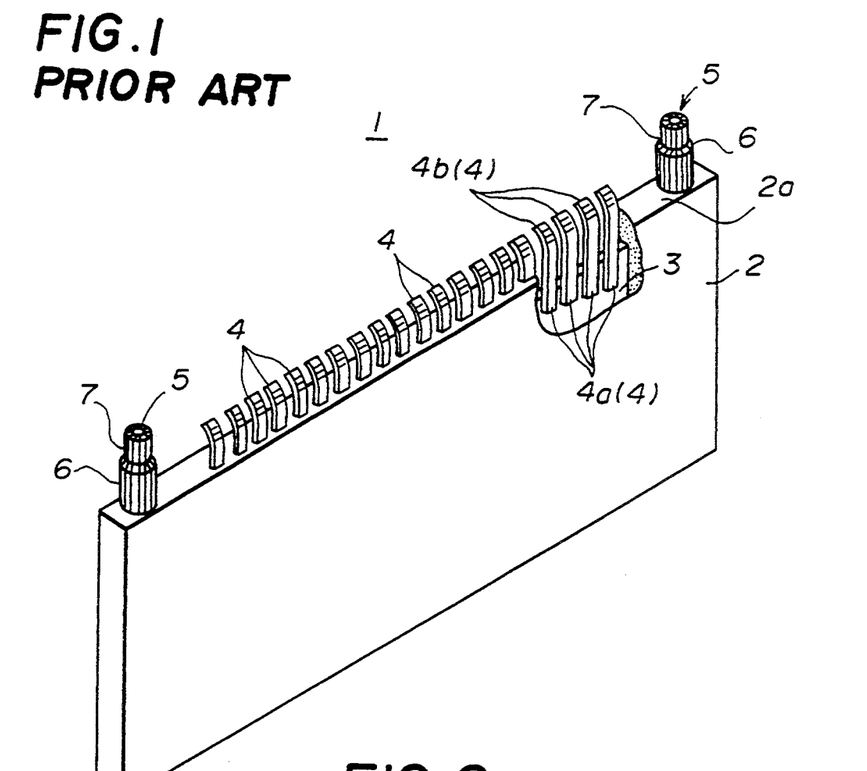
FIG. 1 is a diagram showing a conventional single in-line package designed for surface mounting technology in a perspective view.

In order to combine the advantageous feature of the single in-line package with the advantageous feature of the surface mounting technology, a package structure shown in FIG. 1 is proposed in the U.S. Pat. No. 4,975,763.

Referring to FIG. 1, the package designated by a numeral 1 includes a flat resin package body 2 that accommodates therein a semiconductor chip 3. At an edge 2a of the flat package body 2, there are provided a number of leads each having an inner lead part 4a connected to a bonding pad of the chip 3 and an outer lead part 4b extending outward from the edge 2a. Further, the outer lead part 4b of the leads 4 is bent laterally with respect to the extending direction of the leads 4. In order to support the package body 2 on the substrate at the time of mounting, there is provided a pair of studs 5a each including a stop portion 6 and a cylindrical clip portion 7 of a reduced diameter for inserting into a corresponding hole provided on the substrate.

Figure 2:
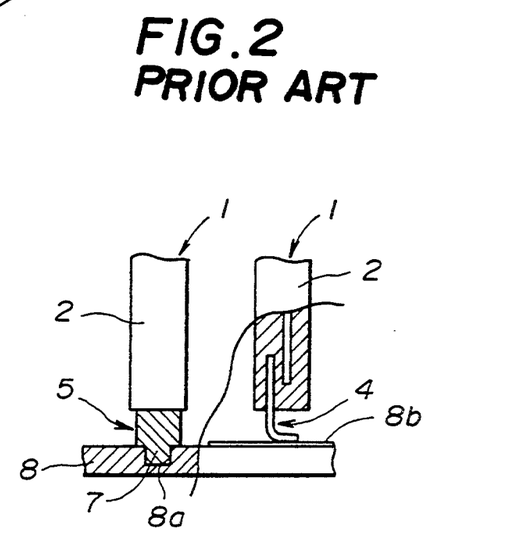
FIG. 2 is a diagram showing the mounting of the package on a substrate.

FIG. 2 shows the mounting of the package 1 on a substrate 8, wherein the substrate 8 is formed with a hole 8a for holding the clip portion 7 of the stud 5. There, the portion 7 is inserted into the hole 8a as shown in FIG. 2 and the package body 2 is held upright on the substrate 8. The substrate 8 carries thereon a conductor pattern 8b for wiring, and the lead 4 is contacted with the conductor pattern 8b when the package 1 is held on the substrate 8. By passing the substrate 8 together with the package 1 in the state shown in FIG. 2, through a furnance the soldering alloy provided on the conductor pattern 8b causes a reflow and the lead 4 is soldered firmly upon the conductor pattern 8.

In this conventional package structure, there is a problem in that one has to provide the hole 8a on the substrate 8 in correspondence to the stud 5 for holding the package body 2 on the substrate 8, As each lead 4 has to engage with corresponding pattern 8b when the package is mounted, it is necessary that the hole 8a be formed with high precision. This requirement is particularly acute in the recent semiconductor devices that have a large number of leads on the package body. The high precision required by this formation of the hole and the insertion of the stud into the hole undermine the advantageous feature of the surface mounting technology, and the efficiency of mounting is inevitably deteriorated.

The package of FIG.1 has another drawback in that each lead 4 has to extend straight from the package body 2 at least for a distance corresponding to the length of the stop portion 6. This straight part of the lead 4 contributes to nothing but causes an unwanted delay of the electrical signals that is carried therethrough. With the increasing operational speed of the semiconductor devices, such a delay may cause a serious problem in the exchange of electric signals between the chip and the conductor pattern on the substrate. Further, such a structure having a long, exposed lead is vulnerable to external noises. As long as one uses the stud for supporting the package body on the substrate, one cannot reduce the length of the lead satisfactorily.

In order to eliminate the problem pertinent to the conventional package of FIG. 1, another single in-line package structure is proposed in the U.S. patent application Ser. No. 881,899 filed May 12, 1992.

Figure 3:
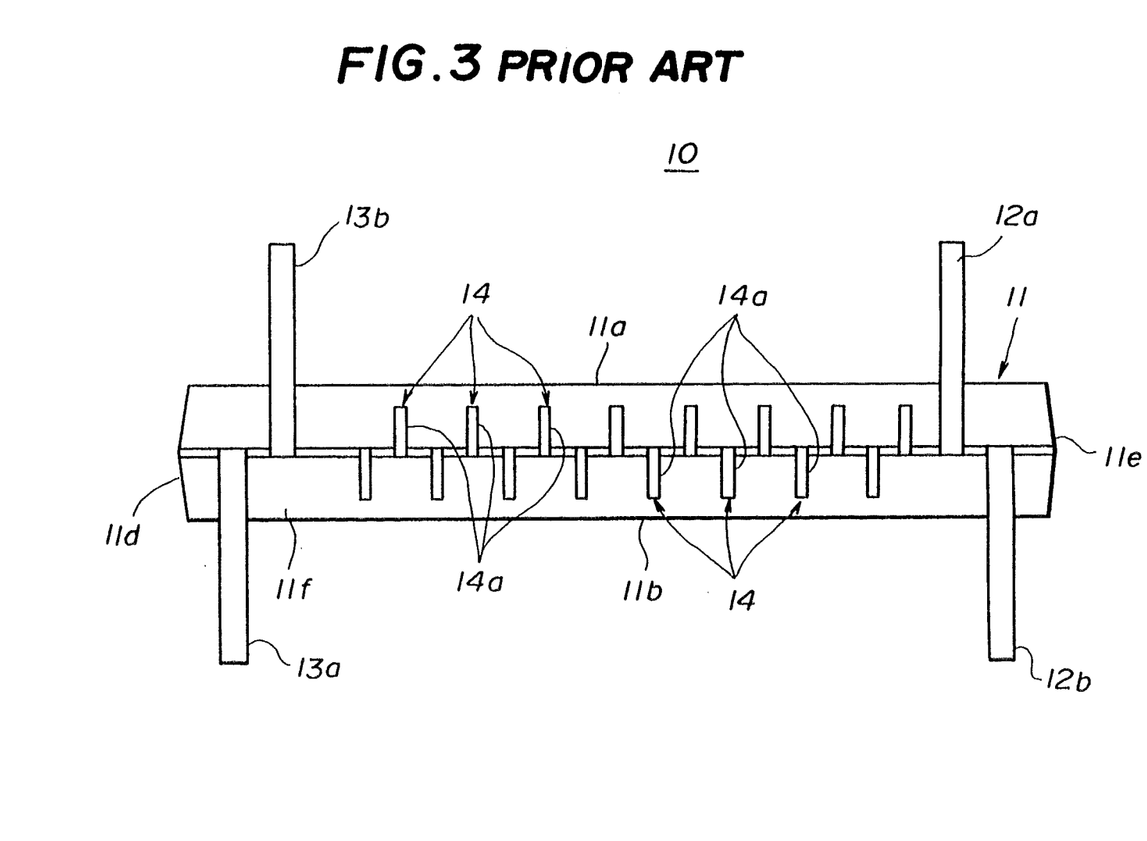
FIG. 3 is a diagram showing another conventional single in-line package in a bottom view.

FIG. 3 shows the bottom view of the package proposed in the foregoing U.S. '899 application.

Referring to FIG. 3, the single in-line type package includes a semiconductor chip not shown in the illustration and a package body 11 that accommodates the semiconductor chip therein. The package body 11 is defined by a pair of opposing major surfaces 11a and 11b and surrounded by a side wall 11d, 11e connecting the two opposing major surfaces 11a and 11b, wherein the side wall includes a substantially straight bottom edge part 11f that extends substantially straight, when viewed in the direction perpendicular to the major surfaces 11a and 11b. A plurality of leads 14 are held by the package body 11 to extend substantially perpendicularly to the edge surface.

Each of the leads 14 is connected to the semiconductor chip electrically, wherein each lead consists of an inner lead part located inside the package body and an outer lead part 14a located outside the package body. There, outer lead part 14a is bent laterally at a boundary between the inner part and the outer part. The leads are bent in one of a first and a second direction such that they are opposite from their adjacent leads and substantially perpendicular to the opposing major surfaces. In addition, the package of FIG. 3 includes a plurality of support legs 12a, 12b, 13a and 13b held by the package body 11 to extend substantially perpendicularly to the edge surface 11f, wherein each of the support legs consists of an inner part located inside the package body and an outer part located outside the package body. There, the outer part of the support leg such as the leg 12a is bent laterally in one of the first and second directions at a boundary between the inner part and the outer part such that the package body is held upright when placed on a substrate.

According to the foregoing construction of FIG.3, the package body 11 is held upright on the substrate by the support legs by simply placing the package body 11 on a substrate such as a printed circuit board. By causing a reflow of a solder alloy in this state, each interconnection lead is connected electrically to a corresponding conductor pattern on the substrate. In other words, the semiconductor package can be mounted on the substrate by the surface mounting technology. Thereby, one can eliminate the process for inserting a stud into a corresponding hole of the substrate as practiced in the conventional device shown in FIG. 1. Associated therewith, one can eliminate the process for forming the holes accurately in the substrate. Thereby, the efficiency of mounting the package on the substrate is significantly improved. The package structure of FIG.3 has another advantageous feature in that the interconnection lead 14 is bent laterally at the root part where it emerges from the package body 11. Thereby, the unnecessary extension of the leads is eliminated and the delay of the electric signals hitherto caused by such a straight part of the lead at the outside of the package body is eliminated. Without the lead extensions the semiconductor device is less vulnerable to external noises. Obviously, this advantageous feature is obtained as a result of use of the support legs 12a, 12b, 13a and 13b that are also bent at the root part.

In spite of various advantageous features described above, the package of FIG.3 still has a drawback in that laterally extending support legs tend to cause an interference with adjacent packages when the packages are mounted with a reduced mutual separation. Thus, one has to secure a relatively large distance between adjacent package bodies when a number of packages are mounted on a common substrate. Unfortunately, such a situation occurs relatively frequently when mounting memory devices on a mother board of computers. Further, because of the limited allowable lateral length of the support legs, the package of FIG.3 has a substantial risk that the package body may fall due to blowing of a hot air for causing the reflow of the solder alloy.

SUMMARY OF THE INVENTION

Accordingly, it is a general object of the present invention to provide a novel and useful semiconductor package wherein the foregoing problems are eliminated.

Another and more specific object of the present invention is to provide a single in-line package for semiconductor devices suitable for surface mounting with a reduced mutual separation.

Another object of the present invention is to provide a semiconductor device having a package of a single in-line type, comprising: a semiconductor chip; a package body that accommodates said semiconductor chip therein, said package body being defined by a pair of opposing major surfaces and surrounded by a side wall connecting said pair of opposing major surfaces, said side wall including a bottom edge part that extends substantially straight, when viewed in a direction perpendicular to said major surfaces, to form a substantially straight bottom edge surface; and a plurality of leads held by said package body to extend substantially perpendicularly to said bottom edge surface, each of said leads being connected to said semiconductor chip electrically, each of said leads consisting of an inner part located inside said package body and an outer lead part located outside said package body, said outer lead part being bent laterally at a boundary between said inner part and outer part, in one of first and second directions such that adjacent leads are opposite from each other and substantially perpendicular to said opposing major surfaces; said package body carrying a cutout part at a predetermined position of said side wall, said cutout part being adapted for engagement with a support leg part for supporting said package body substantially upright on a substrate.

Another object of the present invention is to provide a semiconductor package assembly, comprising: one or more packages of a single in-line type, each of said plurality of packages comprising: a semiconductor chip; a package body that accommodates said semiconductor chip therein, said package body being defined by a pair of opposing major surfaces and surrounded by a side wall connecting said pair of opposing major surfaces, said side wall including an edge part that extends substantially straight, when viewed in a direction perpendicular to said major surfaces, to form a substantially planar edge surface; and a plurality of leads held by said package body to extend substantially perpendicularly to said edge surface, each of said leads being connected to said semiconductor chip electrically, each of said leads consisting of an inner part located inside said package body and an outer lead part located outside said package body, said outer lead part being bent laterally at a boundary between said inner part and outer part, in one of first and second directions such that adjacent leads are opposite from each other and substantially perpendicular to said opposing major surfaces; said package body carrying a cutout part at a predetermined position of said side wall, said cutout part being adapted for engagement with a support leg means for supporting said package body substantially upright on a substrate; and support leg means provided commonly to said plurality of packages such that said support leg means is accommodated into said cutout part, said support leg means supporting said plurality of said packages substantially upright upon a common substrate.

Another object of the present invention is to provide a process for mounting a semiconductor package on a substrate, comprising the steps of: mounting a support member on a semiconductor package body, said support member being adapted for holding said package body substantially upright when placed upon a substrate; placing said package member carrying therewith said support member, on a substrate; and causing a reflow of a solder pattern provided on said substrate to establish a firm mechanical and electrical contact between said solder pattern and interconnection leads provided on said package body.

According to the present invention, one can mount a number of semiconductor packages on a common substrate with a reduced mutual separation, by using the surface mounting technology. Thereby, the efficiency of utilization of the surface area of the substrate is improved substantially, together with the improvement in the efficiency for the mounting process that is achieved as a result of the surface mounting technology.

DETAILED DESCRIPTION OF THE PREFERRED EMBODIMENTS

Figures 4A, 4B:
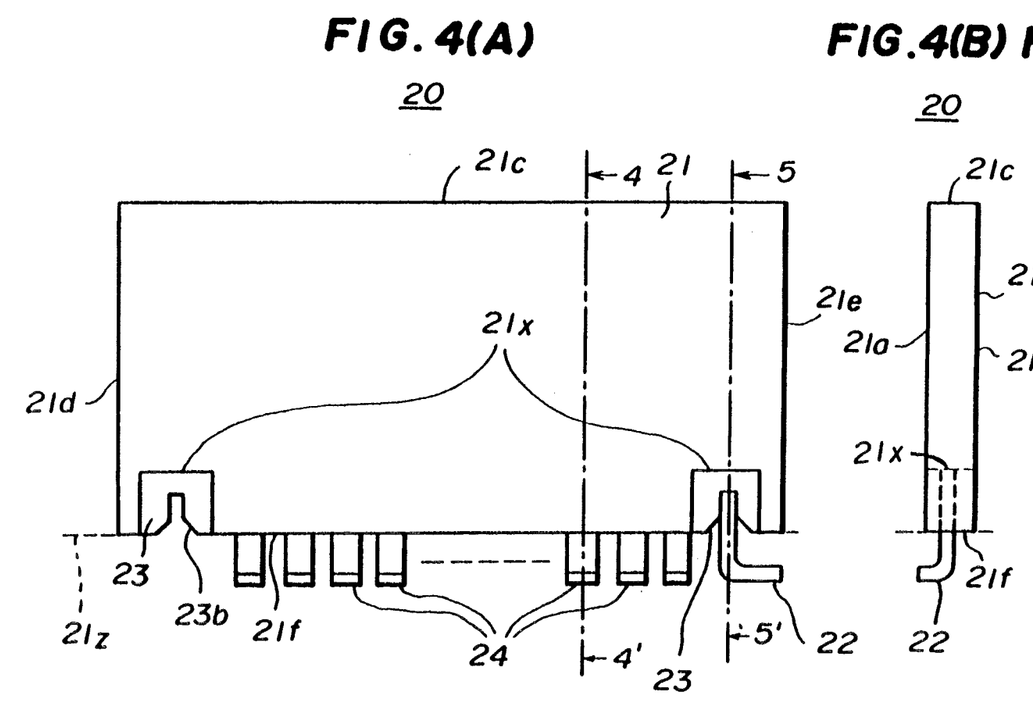
FIGS. 4(A)–4(C) are diagrams showing the semiconductor package according to a first embodiment of the present invention.
Figure 4C:
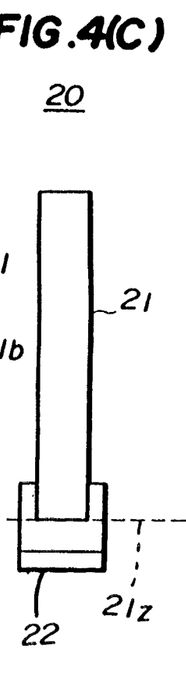

FIGS. 4(A)–4(C) show a semiconductor package 20 according to a first embodiment of the present invention.

Referring to the drawings, the semiconductor package 20 includes a resin package body 21 that is defined laterally by a pair of opposing major surfaces 21a and 21b. Further, the major surfaces 21a and 21b are separated from each other by a side wall that includes a top edge 21c and an opposing bottom edge 21f, as well as two mutually opposing side edges 21d and 21e. There, the edges 21c–21f surround the package body 21, and it will be noted that at least the bottom edge 21f extends generally parallel to the flat upper major surface of a substrate (not shown in FIGS. 4(A)–4(C)) on which the package body is going to be placed by the surface mounting technology. In correspondence to the bottom edge 21f, a number of interconnection leads protrudes from the package body 21, and the tip end of the interconnection lead is bent laterally for engagement with a conductor pattern provided on the substrate that may be a printed circuit board.

In the package 20 of FIG. 4(A), the resin package body 21 is formed with a cutout region 21x in correspondence to the bottom edge 21f to expose a lead frame 23, wherein the lead frame 23 is embedded in the package body 21 for supporting a semiconductor chip thereon (see FIG. 5 to be described later). Further, the exposed part of the lead frame 23 is provided with a cutout 23b for engagement with a support leg member 22 as illustrated in FIGS. 4(A)–4(C). There, FIG. 4(B) shows the cross section of FIG. 4(A) taken along a line 4–4' while FIG. 4(C) shows the cross section taken along a line 5–5'. As will be noted in FIG. 4(A), the support leg 22 is formed of an L-shaped member having a leg part bent approxiametely parallel to the bottom edge 21f for engagement with the surface of the substrate. On the other hand, it will be noted from FIG. 4(C) that the support leg 22 has a limited lateral size in the direction perpendicular to the major surfaces 21a and 21b of the package body 21. Thereby, one can avoid the problems of the support legs 22 causing an interference as in the case of the package of FIG. 3, particularly when the distance between the packages is reduced.

In the structure of FIGS. 4(A)–4(C), it should be noted that the lower edge of the exposed lead frame 23 at the level 21z substantially coincides with the lower edge of the package body 21.

Figure 5:
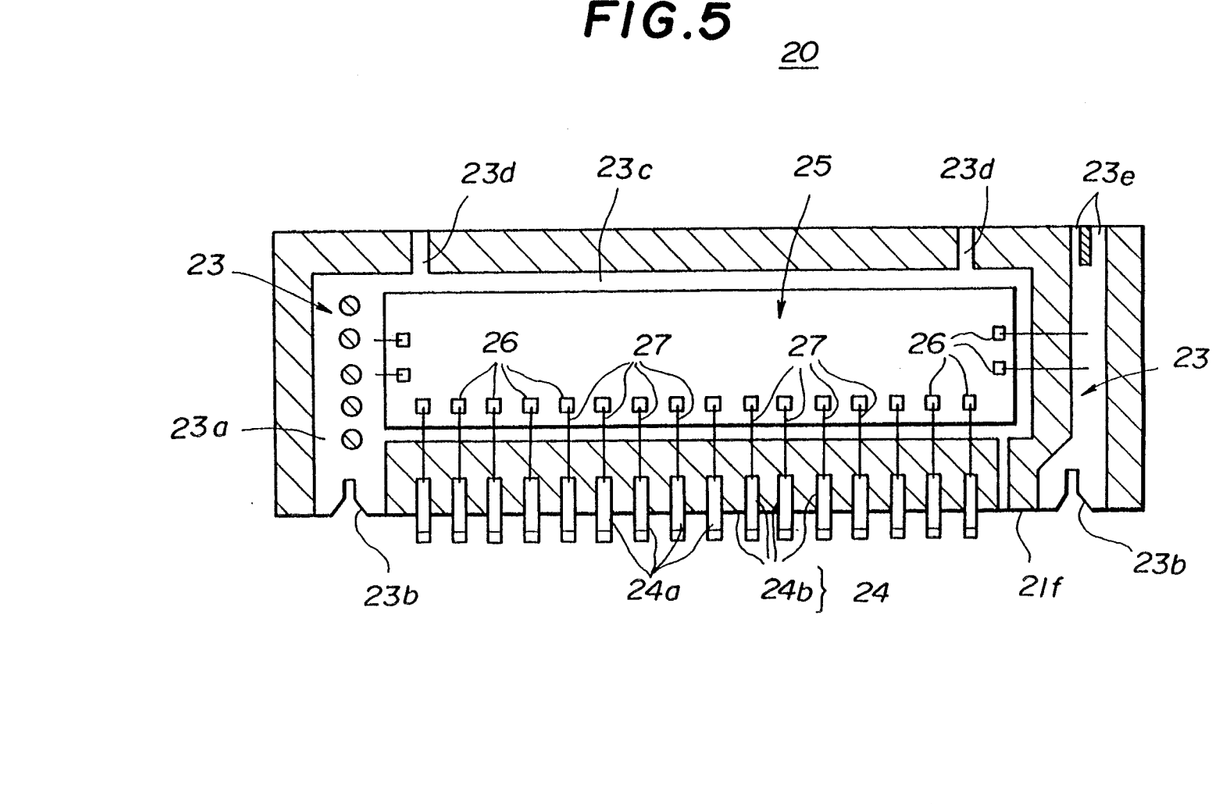
FIG. 5 is a diagram showing the interior of the semiconductor package of the first embodiment of the present invention.

FIG. 5 shows the internal structure of the semiconductor package 20.

Referring to FIG. 5, the semiconductor device 20 includes the lead frame 23 described briefly with reference to FIG. 4(A), wherein the lead frame 23 is formed of a first lead frame part 23a and a second lead frame part 23e both embedded in the resin package body 21. As shown in FIG. 5, the lead frame part 23a is formed with the cutout 23b adjacent the cutout 21x of the resin package body 21. Similarly, the second lead frame part 23e includes a similar cutout represented also by the numeral 23b adjacent the cutout 21x of the resin package body 21.

The lead frame 23 further includes a stage part 23c for supporting the semiconductor chip 25 thereon. In the illustrated example, the stage part 23c has an elongated rectangular form in correspondence to an elongated rectangular form of the chip 25. In correspondence to the stage part 23c, the package body 21 also has an elongated rectangular form.

The semiconductor chip 25 has a number of bonding pads 26 formed along a lower edge of the chip when mounted on the lead frame 23, and each bonding pad 26 is connected to a corresponding lead 24 by a bonding wire 27. Typically, an Au wire is used for the bonding wire 27, wherein the wire 27 is bonded at an inner lead part 24b of the lead as usual. Further, some of the bonding pads 26 may be connected to the lead frame parts 23a and 23e for the ground connection. In this case, the support leg 22 is placed on the substrate in correspondence to a ground pattern.

In fabrication, a single lead frame that corresponds to the lead frame 23 and includes therein the lead frame part 23a and the lead frame part 23b is used, and the semiconductor chip 25 is mounted on such a lead frame 23 at a part that corresponds to the stage part 23c. Thereby, the original lead frame 23 includes openings that correspond to the two cutouts 23b. Next, the bonding wires 27 are provided for connecting the bonding pads 26 and the corresponding leads 24, and a resin package body 21 is formed by a molding process such that the package body 21 encapsules the lead frame 23 as well as the semiconductor chip 25 therein. After the package body 21 is thus formed, the lead frame 23 is cut to form the separated lead frame parts 23a and 23e. Thereby, the foregoing two cutouts 23b are formed as explained previously. Simultaneously, the interconnection leads 24 are formed. After the cutting process, the outer lead part 14a of the lead 14 is bent laterally for engagement with the conductor pattern on the substrate.

Figure 6A:
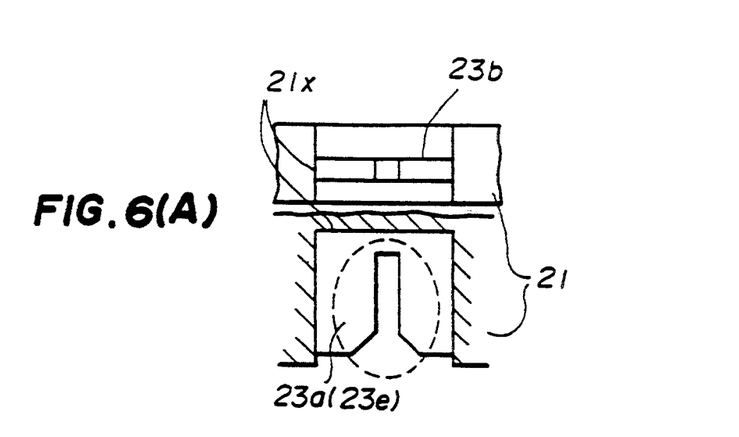
FIGS. 6(A)–6(D) are diagrams showing various modifications of the first embodiment.
Figure 6B:
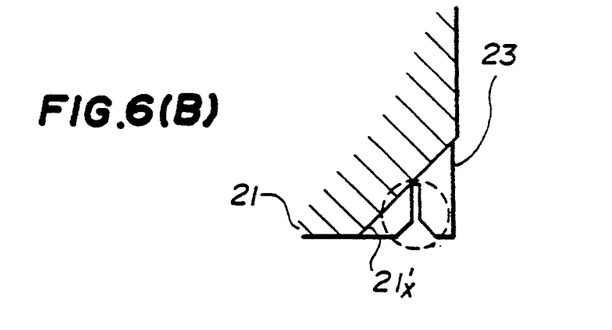
Figure 6C:
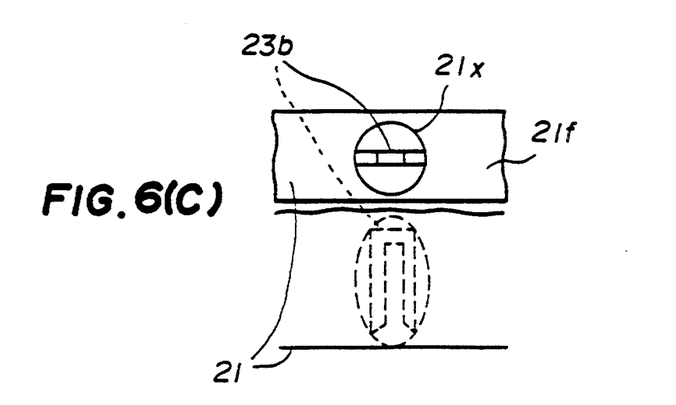

FIGS. 6(A)–6(C) show various examples of the cutout 23b, wherein FIG. 6(A) shows the cutout 23b corresponding to the embodiment of FIG. 4(A) and FIG. 5. In FIG. 6(A), the upper illustration represents the bottom view of the cutout region 21x of the package body 21 in an enlarged scale while the lower illustration represents the side view of the cutout region 21x.

FIG. 6(B) shows a modification of the first embodiment, wherein a cutout region 21x is formed at the corner of the package body 21. In this embodiment, too, one can provide a support leg in correspondence to the cutout 23b formed in the exposed part of the lead frame 23.

FIG. 6(C) shows another modification of the first embodiment, wherein a hole 21 x is formed in correspondence to the bottom surface 21f of the package body 21 to penetrate into the package body, and the lead frame 23 carrying the cutout 23b is exposed in correspondence to the hole 21.

Figure 6D:
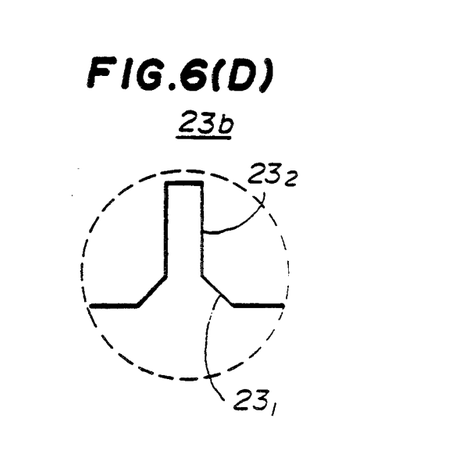

FIG. 6(D) shows the cutout 23b in detail, wherein it will be noted that the cutout 23b includes a chamfer $23_1$ for facilitating the insertion of the support leg 22 and a groove $23_2$ formed in continuation to the chamber $23_1$ for holding the support leg 22 firmly. Thereby, the mounting of the leg 22 is substantially facilitated.

Figure 7A:
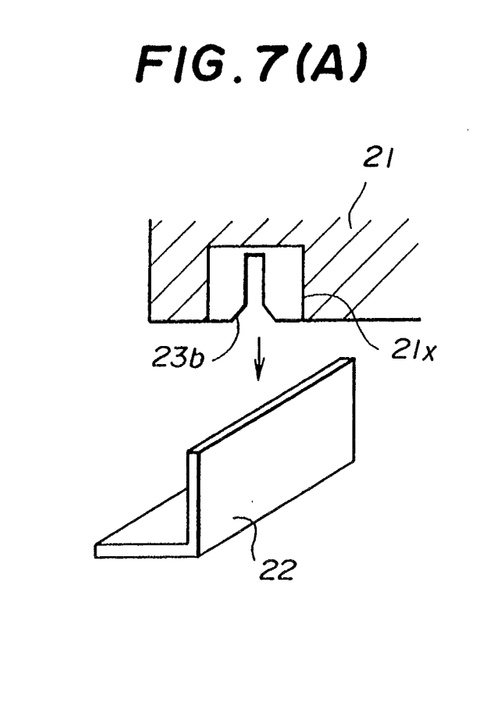
FIGS. 7(A)–7(C) are diagrams showing various modifications of the first embodiment.
Figure 7B:
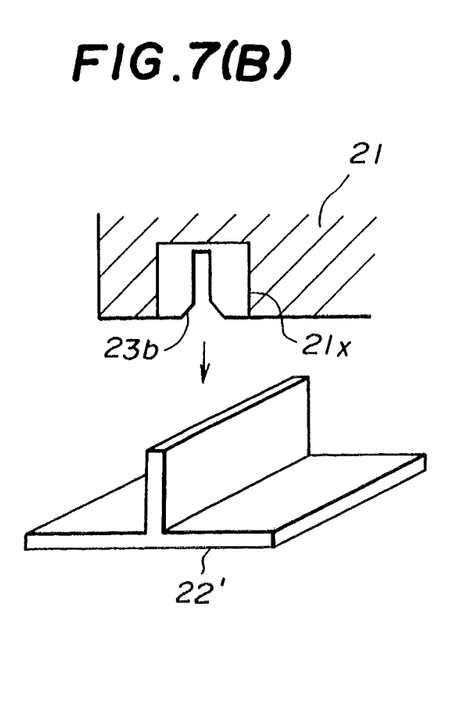
Figure 7C:
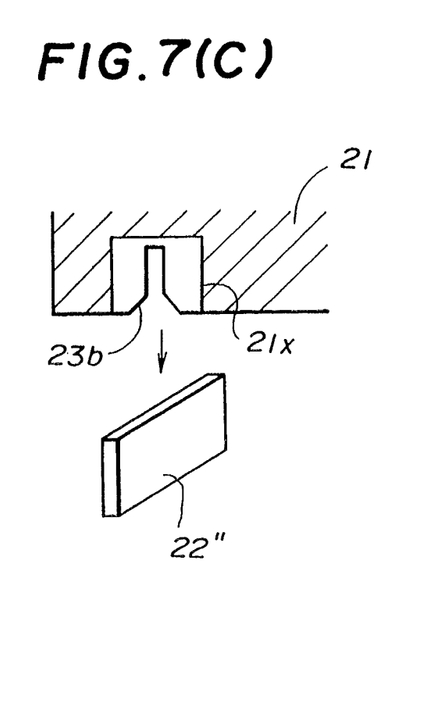

FIGS. 7(A)-7(C) show various modifications of the support leg 22 that may be used in combination with the cutout 23b exposed in correspondence to the package 20 of the first embodiment. Referring to the drawings, FIG. 7(A) shows use of a support leg member 22 having an L-shaped cross section, while FIG. 7(B) shows use of a support leg member 22' having a T-shaped cross section. Further, FIG. 7(C) shows use of a support leg member 22" that has a rectangular cross section. Any of these support leg members can be used for supporting the package body 21 of the present embodiment upright on the surface of the substrate.

Figure 8A:
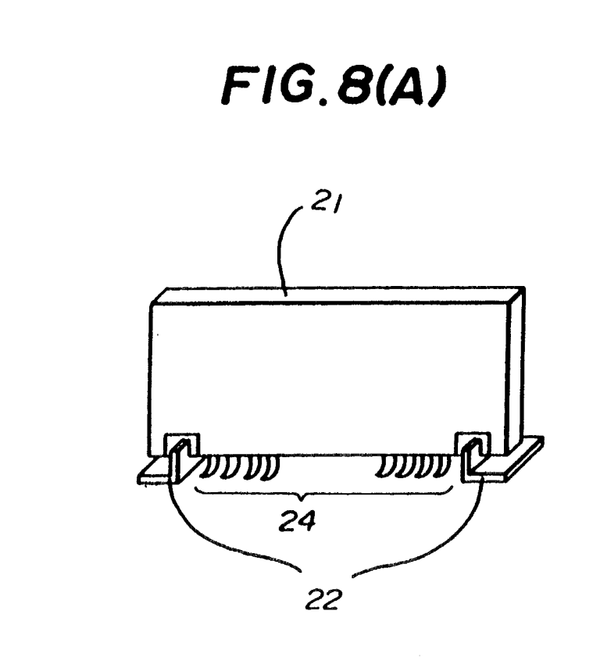
FIGS. 8(A) and 8(B) are diagrams showing a second embodiment of the present invention.
Figure 8B:
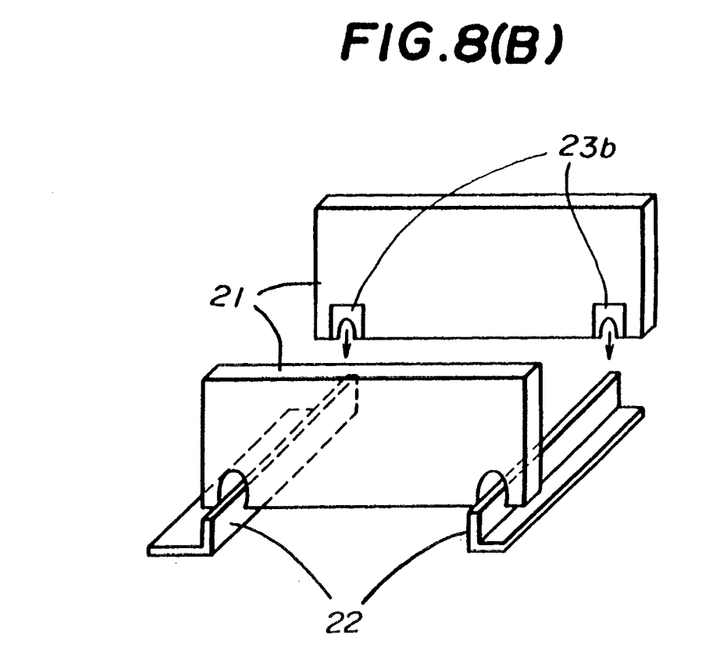

FIGS. 8(A) shows the semiconductor package 20 of the first embodiment in the perspective view wherein a single package body 21 is held on the support leg 22, while FIG. 8(B) shows a second embodiment of the present invention wherein a number of the package bodies 21 are held commonly on a support leg 22. In the illustrated example, the support leg 22 has an L-shaped cross section in correspondence to the example of FIG. 7(A) and extends with a substantial length such that a number of package bodies 21 are held thereon with a reduced mutual separation. By configuring the semiconductor assembly as such, it is possible to support the package bodies upright on the substrate such as printed circuit board with an improved mechanical stability as compared with the embodiment of FIG. 8(A).

Figure 9:
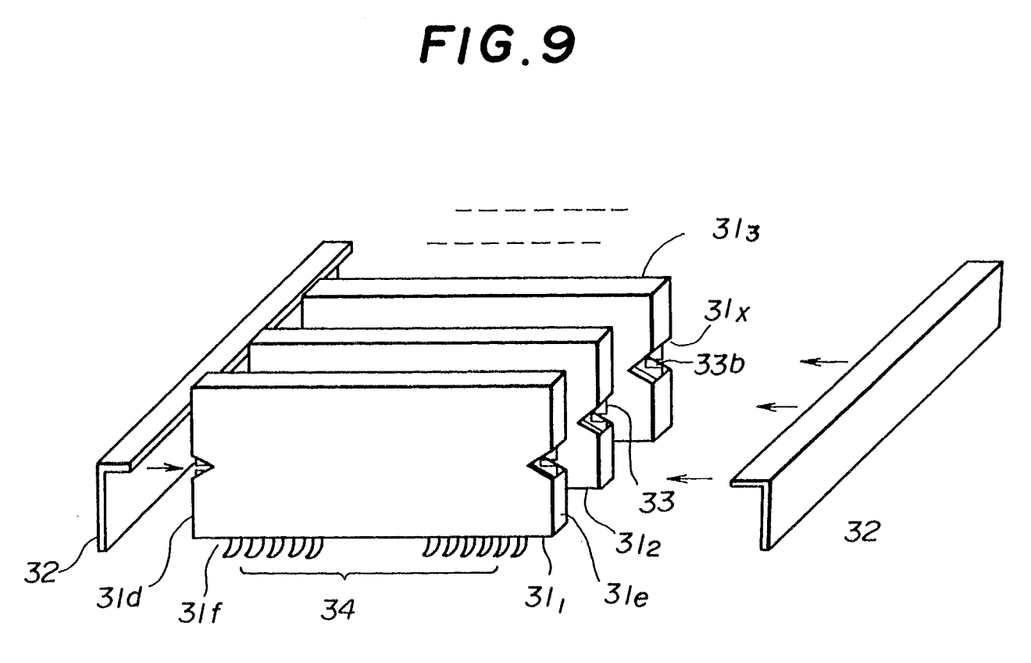
FIG. 9 is a diagram showing a third embodiment of the present invention.

FIG. 9 shows a third embodiment of the present invention, wherein a number of package bodies $31_1$-$31_3$ are held adjacent to and parallel with each other with a reduced mutual separation. There, each package body such as the package body $31_1$ has a construction substantially identical with the package body 21, except that the package body $31_1$ is formed with a cutout $31_x$ for exposing a lead frame 33 that corresponds to the lead frame 23 of the previous embodiment, on both side walls 31d and 31e rather than at the bottom edge 31f. It should be noted that the side walls 31d and 31e correspond to the side walls 21d and 21e of the previous embodiment, while the bottom edge 31f corresponds to the bottom edge 21f.

There, the exposed part of the lead frame 33 carries a cutout 33b corresponding to the cutout 23b, and a pair of L-shaped rails 32 are engaged into the cutout 23b from both sides of the package bodies $31_1$-$31_3$ as indicated by arrows, as the support leg. Thereby, the package bodies $31_1$-$31_3$ are held upright on the substrate such as a printed circuit board with a reduced mutual separation and improved mechanical stability. Further, the construction of FIG. 9 that eliminates the engagement of the support leg 32 with the bottom edge of the package body 31, enables a minimization in the straight portion of the outer lead part of the interconnection leads 34. In other words, it is possible to configure the outer lead part of the leads 34 to be bent laterally immediately upon emerging from the package body such as the package body $31_1$. Thereby, the delay in the signals traveling through the leads 34 can be minimized. Further, the risk that external noises are picked up at such an extraneous straight portion of the interconnection leads 34 is minimized.

In the foregoing construction of the present invention, it should be noted that the support legs 22 or 32 are engaged directly to the lead frame 23 or 33 that is embedded in the resin package body for supporting a semiconductor chip such as the chip 25. Thereby, the heat produced at the semiconductor chip 25 is dissipated easily via the support legs 22 to the printed circuit board, and one can obtain a cooling effect substantially comparable to the cooling effect that is obtained when a cooling fin is provided on the semiconductor chip. For this purpose, it is preferable to form the support legs 22 or 32 by an excellent heat conductor such as the Ni—Fe alloy that is the same material used for the lead frame.

Once the semiconductor package or package assembly is mounted upon the substrate such as a printed circuit board, the reflowing of solder alloy is caused by applying a hot air to the substrate. Alternatively, one may cause the printed circuit board thus carrying thereon the package or package assembly in a furnace to cause the desired reflowing.

Further, the present invention is not limited to the embodiments described heretofore, but various variations and modifications may be made without departing from the scope of the invention.

What is claimed is:

1. A semiconductor device having a package of a single in-line type, comprising:
   a semiconductor chip;
   a package body that accommodates said semiconductor chip therein, said package body being defined by a pair of opposing major surfaces and surrounded by side walls connecting said pair of opposing major surfaces, said side walls including a bottom edge which extends in a direction perpendicular to said major surfaces, to form a substantially planar bottom edge surface;
   a plurality of leads held by said package body so as to extend substantially perpendicularly to said bottom edge surface, each of said leads being electrically connected to said semiconductor chip, each of said leads comprising an inner part located inside said package body and an outer lead part located outside said package body, said outer lead part being bent laterally in the vicinity of the boundary between said inner part and said outer part, in one of a first and a second direction that are opposite from each other and substantially perpendicular to said opposing major surfaces; and
   said package body having a cutout part at a predetermined position of said side wall, said cutout part being adapted for engagement with a support leg part for supporting said package body substantially upright on a substrate;
   wherein said package body includes a lead frame, for holding said semiconductor chip thereon, said lead frame comprising a cutout portion for engagement with a support leg, said cutout part of said package body exposing said lead frame cutout portion.

2. A semiconductor package as claimed in claim 1, wherein said cutout part is formed at said bottom edge surface.

3. A semiconductor package as claimed in claim 1, wherein said side walls further comprise a side edge connecting said bottom edge to an opposing top edge of said package body wherein, said cut out part is formed at said side edge of the package body.

4. A semiconductor package as claimed in claim 1, wherein said package body includes a lead frame, for holding said semiconductor chip thereon, comprising a cutout portion for engagement with a support leg, said package cutout part exposing said lead frame cutout portion.

5. A semiconductor package as claimed in claim 4, wherein said lead frame cutout portion further comprises:
   a chamfer formed in said lead frame for facilitating said engagement of said support leg part; and
   a groove provided in continuation to said chamfer for establishing said engagement with said support leg part.

6. A semiconductor package as claimed in claim 4, wherein said lead frame is formed of a metal.

7. A semiconductor package assembly, comprising:
   a plurality of packages of a single in-line type, each of said plurality of packages comprising:
      a semiconductor chip;
      a package body that accommodates said semiconductor chip therein, said package body being defined by a pair of opposing major surfaces and surrounded by side walls connecting said pair of opposing major surfaces, said side walls including a bottom edge which extends in a direction perpendicular to said major surfaces, to form a substantially planar edge surface; and
      a plurality of leads held by said package body so as to extend substantially perpendicularly to said planar edge surface, each of said leads being electrically connected to said semiconductor chip, each of said leads comprising an inner part located inside said package body, and an outer lead part located outside said package body, said outer lead part being bent laterally in the vicinity of the boundary between said inner part and said outer part, in one of a first and a second direction that are opposite from each other and substantially perpendicular to said opposing major surfaces;
   said package body carrying a cutout part at a predetermined position of said side wall, said cutout part being adapted for engagement with a support leg part for supporting said package body substantially upright on a substrate; and
   support leg means provided commonly to said plurality of packages such that said support leg means is accommodated into said cutout part, said support leg means supporting said plurality of said packages substantially upright upon a common substrate.

8. A semiconductor package assembly as claimed in claim 7, wherein said support leg means comprises a member having an L-shaped cross section.

9. A semiconductor package assembly as claimed in claim 7, wherein said support leg means comprises a member having a T-shaped cross section.

10. A semiconductor package assembly as claimed in claim 7, wherein said support leg means comprises a member having a rectangular cross section.

* * * * *

UNITED STATES PATENT AND TRADEMARK OFFICE
CERTIFICATE OF CORRECTION

PATENT NO. : 5,446,317
DATED : Aug. 29, 1995
INVENTOR(S) : SATO et al.

It is certified that error appears in the above-indentified patent and that said Letters Patent is hereby corrected as shown below:

Col. 8, line 63 (claim 3, line 4), change "body wherein," to --body, wherein--.

Signed and Sealed this

Twenty-sixth Day of December, 1995

Attest:

BRUCE LEHMAN

Attesting Officer     Commissioner of Patents and Trademarks